United States Patent
August et al.

(10) Patent No.: US 11,256,287 B2
(45) Date of Patent: Feb. 22, 2022

(54) APPARATUS AND METHOD TO MAINTAIN STABLE CLOCKING

(71) Applicant: Intel Corporation, Santa Clara, CA (US)

(72) Inventors: Nathaniel August, Portland, OR (US); Muhammed Elgousi, Chandler, AZ (US); Benjamin Gordon, Seattle, WA (US); Tsai-Yuan Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 16/440,890

(22) Filed: Jun. 13, 2019

(65) Prior Publication Data

US 2020/0393869 A1    Dec. 17, 2020

(51) Int. Cl.
*G06F 1/12*   (2006.01)
*H03L 7/14*   (2006.01)
*H03B 5/32*   (2006.01)
*H03L 7/08*   (2006.01)

(52) U.S. Cl.
CPC ............ *G06F 1/12* (2013.01); *H03B 5/32* (2013.01); *H03L 7/0807* (2013.01); *H03L 7/148* (2013.01)

(58) Field of Classification Search
CPC ..... G06F 1/00; G06F 1/10; G06F 1/12; G06F 1/14; G06F 5/00; G06F 5/06; H03B 5/00; H03B 5/32; G11C 29/00; G11C 29/021; G11C 29/023; G11C 29/50; G11C 5/00; G11C 5/04; G11C 5/14; G11C 5/147; G11C 7/00; G11C 7/04; G11C 7/22;
(Continued)

(56) References Cited

U.S. PATENT DOCUMENTS 3,597,732 A * 8/1971 Morimoto ............ G06K 9/4638
                                                    382/200
7,149,145 B2   12/2006 Kim et al.
2004/0080347 A1  4/2004 Wong et al.
(Continued)

FOREIGN PATENT DOCUMENTS

JP        2014131134        7/2014

OTHER PUBLICATIONS

International Search Report & Written Opinion dated Aug. 24, 2020 for PCT Patent Application No. PCT/US2020/032231.
(Continued)

*Primary Examiner* — Daniel C Puentes
*Assistant Examiner* — Dave Mattison
(74) *Attorney, Agent, or Firm* — Schwabe, Williamson & Wyatt, P.C.

(57) ABSTRACT

Both before and after a surprise clock stop, the apparatus and method of various embodiments supplies a stable and continuous clock to a memory module with a unique arrangement of circuit components, including a clock detector circuit, a clock-smoothing circuit, and one or more PLLs. Upon detection of a stopped host clock, a first PLL seamlessly switches to an alternate reference clock from an on-board crystal oscillator. A clock smoothing circuit allows the first PLL to maintain a steady phase and frequency without inducing glitches or period excursions greater than the natural jitter of the locked PLL; one or more optional downstream PLLs may drive additional clock domains.

19 Claims, 7 Drawing Sheets

(58) Field of Classification Search
CPC ......... G11C 7/222; H03L 7/00; H03L 7/0807;
H03L 7/089; H03L 7/148
USPC ........................................................ 713/400
See application file for complete search history.

(56) References Cited

U.S. PATENT DOCUMENTS

2005/0190001 A1* 9/2005 Ogiso ................... H03L 7/0995
331/74
2007/0069825 A1 3/2007 Wong et al.
2014/0173321 A1* 6/2014 Dobbs ................ G06F 11/1604
713/400
2017/0366190 A1* 12/2017 Leong ....................... H03L 7/14

OTHER PUBLICATIONS

Intel® Optane™ DC Persistent Memory. 2018, 4 pages. [Online]. Available https://www.intel.com/content/www/us/en/products/docs/memory-storage/optane-persistent-memory/what-is-intel-optane-dc-persistent-memory-video.html.
Pann, A. et al. "Adaption of solid tantalum chip capacitors for high frequency DC DC power supplies", Proceedings of the 15th Annual Telecommunications Energy Conference, pp. 226-228, 1993.

\* cited by examiner

APPARATUS AND METHOD TO MAINTAIN STABLE CLOCKING

BACKGROUND

Several types of solid-state, high-density, non-volatile memory (NVM) provide persistent storage in commercial computer systems. Such technologies include Intel® Optane™ DC Persistent Memory, spin transfer torque—magnetic random access memory (STT-MRAM), resistive RAM (ReRAM), NAND, conductive bridging RAM (CBRAM), or phase change memory (PCM). These memories may be implemented on a memory module, where a memory controller links the non-volatile memory to a processor (e.g., central processing unit (CPU)) via one or more high-speed interfaces such as PCIe (peripheral component interconnect express) or DDR (double data rate interface). These memories rely on a stable clock for reading and writing purposes. A sudden or unexpected stop or disappearance of the clock may corrupt or halt an ongoing write operation.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

For clocking and synchronization over a memory interface, memory modules depend on either a direct clock from a host processor (e.g., CPU) or on a reference clock signal from the host processor that is used for on-board clock regeneration in the memory module. A host or module power failure, module unseating, thermal trip, or other malfunction can cause unexpected and unannounced losses of the host clock, which the memory module considers as a "surprise clock stop."

One problem arises at the time of a surprise clock stop, when the host processor (or simply a host) and memory module may have very different perspectives on the status of a transaction. The host considers all writes that the memory module receives before a surprise clock stop to be safely stored in its persistent memory. However, after the memory module receives the data, it uses hundreds or thousands of clock cycles to finish the complex task of writing to the media (e.g., persistent memory). In addition, since a surprise clock stop may be caused by a power loss, the memory module is expected to complete these writes within a limited time window in which hold-up capacitors can safely maintain the module's power supply levels. When a clock stop occurs after the host transaction completes but before the memory module finishes writing all data, numerous issues with data integrity and security are seen, including circuit instability, data loss, illegal register access, FIFO (first-in-first-out) underflow, and firmware state corruption. These issues can be avoided if the module maintains a continuous and stable clock after a surprise clock stop event.

To solve this problem, after a surprise clock stop, a reset sequence can be initiated that includes locking or re-locking a phase locked loop (PLL) to an alternate reference clock source, such as an on-module crystal oscillator. The output of the PLL then drives the clock distribution network after the PLL locks to a steady state.

However, reset sequences can take many thousands of clock cycles just to lock a PLL and enable downstream clocking circuits such as DLLs (delay locked loops) or clock-crossing queues. A far better use of this valuable time would be to complete in-flight operations on schedule to meet the required latency limits for a given protocol or for a given physical media type. In addition, long reset sequences require the module's power supplies to remain held up for a longer time after power loss resulting in additional expense and area for either additional hold-up capacitors or more expensive materials such as tantalum.

Another way to solve the problem of sudden clock stop is to switch to a new clock source that directly drives the clock distribution network. The new clock source may be either an on-module crystal oscillator or an on-die ring oscillator.

However, when switched in, the new clock source can introduce glitches into the clock distribution network—either as runt pulses, elongated periods, or shortened periods. Runt pulses may evaporate intermittently and at different physical locations in the memory controller; elongated periods may cause downstream delay lines to malfunction; and shortened periods can cause timing failures. In addition, an unsteady clock may cause synchronous clock crossings to fail. Further, if the new clock is from an on-die ring oscillator, the inherent device and supply noise may cause increasingly elongated or shortened periods over time that are not corrected as the noise accumulates, eventually leading to timing failures.

Another solution is that for memory controllers that synthesize a clock from the host clock, a surprise clock stop can be handled by freezing the state of the PLL's oscillator control as a voltage on a capacitor (for analog PLLs) or as a digital control word (for digital PLLs). In the case of stop clock scenario, since the PLL is now operating in open-loop mode with a static oscillator control value, there are no corrections to the oscillator phase or frequency, however. The device and supply noise may cause elongated periods or shortened periods over time that are not corrected as the noise accumulates, eventually leading to timing failures.

Some embodiments solves the problem of sudden clock stop by guaranteeing a stable and continuous clock to the memory module even after a surprise clock stop event, thus ensuring timely completion of all on-module operations and preserving the integrity and security of the data. Both before and after a surprise clock stop, the apparatus of some embodiments supply a stable and continuous clock to a memory module with a unique arrangement of circuit components, including a clock detector circuit, a clock-smoothing circuit, and one or more PLLs. Upon detection of a stopped host clock, a first PLL seamlessly switches to an alternate reference clock, for example, from an on-board crystal oscillator. The clock smoothing circuit allows the first PLL to maintain a steady phase and frequency without inducing glitches or period excursions greater than the natural jitter of the locked PLL. In some embodiments, one or more downstream PLLs may drive additional clock domains from the first PLL.

The apparatus and scheme of various embodiments enable a memory controller to continuously drive a memory module's clock distribution network with a glitch-less clock that is stable in both frequency and phase before and after a surprise clock stop. There may be no need to re-lock any PLL and zero time wasted on reset sequences to re-lock a PLL or adjust downstream clocking circuitry like DLLs or clock crossings. The apparatus and scheme of various embodiments guarantee the completion of in-flight operations on the same schedule as in normal operation, thus meeting required latency limits for a given protocol or physical media type, maintaining data integrity, and reducing the expense and board area of hold-up capacitors. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 1:
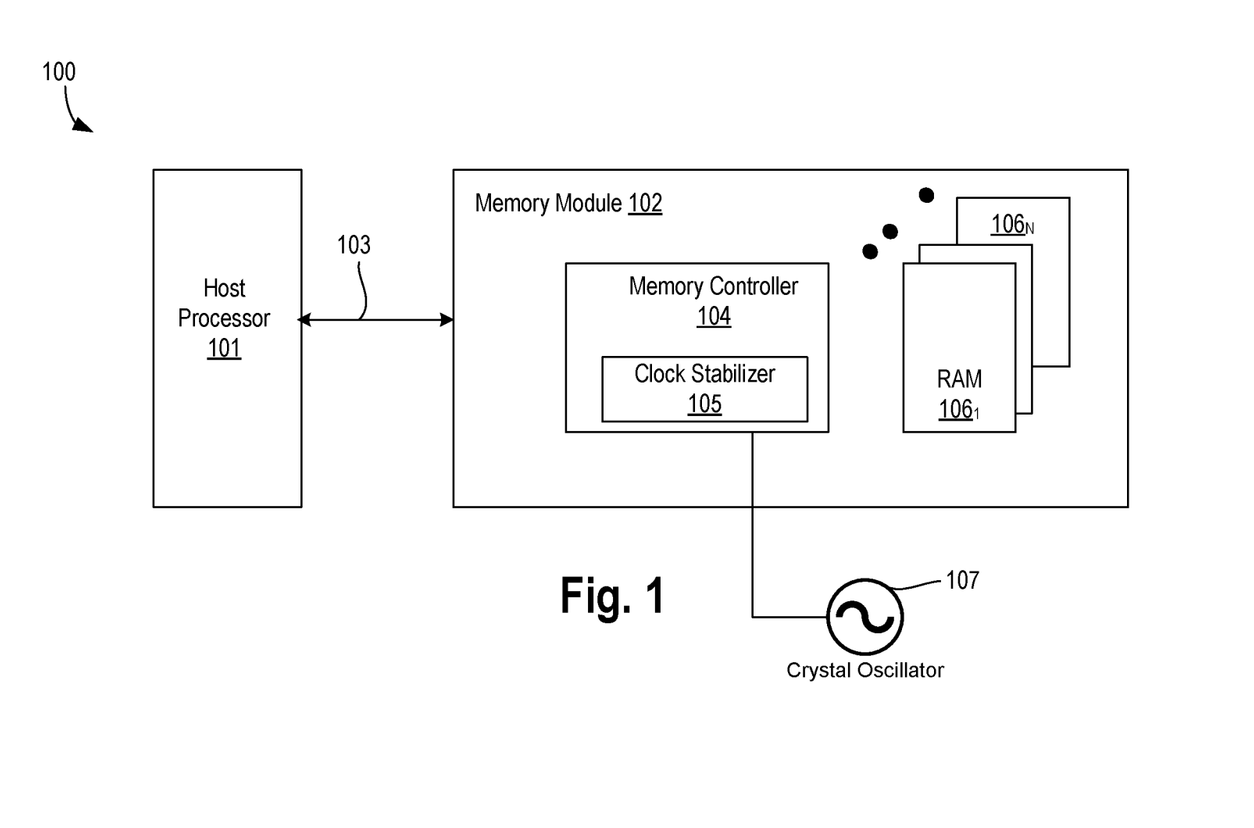
FIG. 1 illustrates a high-level architecture of a memory module with apparatus to maintain stable clocking, according to some embodiments of the disclosure.

FIG. 1 illustrates high-level architecture 100 with a memory module with apparatus to maintain stable clocking, according to some embodiments of the disclosure. Architecture 100 comprises host processor 101, memory module 102, and host-to-memory interface 103 (e.g., DDR, PCIe, etc. interface). In various embodiments, memory module 102 includes memory controller 104 having clock stabilizer apparatus 105, and N number of memory banks $106_{1-N}$, where N is an integer greater than one. The memory banks can be volatile or non-volatile memory. Examples of memory for the memory banks include: spin transfer torque-magnetic random access memory (STT-MRAM), resistive RAM (ReRAM), NAND, conductive bridging RAM (CBRAM), or phase change memory (PCM). In various embodiments, memory module 102 includes or is coupled to another clocking source 107. In this example, the additional clocking source is a crystal oscillator 107. Crystal oscillator 107 can be packaged in the same package as the memory module, or can be off package. Interface 103 provides data, clock (strobe), and control signals. When the clock from host processor 101 stops, clock stabilizer apparatus 105 makes sure that memory controller 104 continues to operate as expected without issues with data integrity and security, including circuit instability, data loss, illegal register access, FIFO underflow, and firmware state corruption.

In some embodiments, both before and after a surprise clock stop from host processor 101, clock stabilizer apparatus 105 supplies a stable and continuous clock to memory controller 104 and memory banks $106_{1-N}$ using a clock detector circuit, a clock-smoothing circuit, and one or more PLLs. Upon detection of a stopped host clock, by clock stabilizer apparatus 105, a first PLL seamlessly switches to an alternate reference clock from an on-board crystal oscillator 107. A clock smoothing circuit of clock stabilizer apparatus 105 allows the first PLL to maintain a steady phase and frequency without inducing glitches or period excursions greater than the natural jitter of the locked PLL. In some embodiments, one or more optional downstream PLLs may drive additional clock domains within memory module 102.

Figure 2:
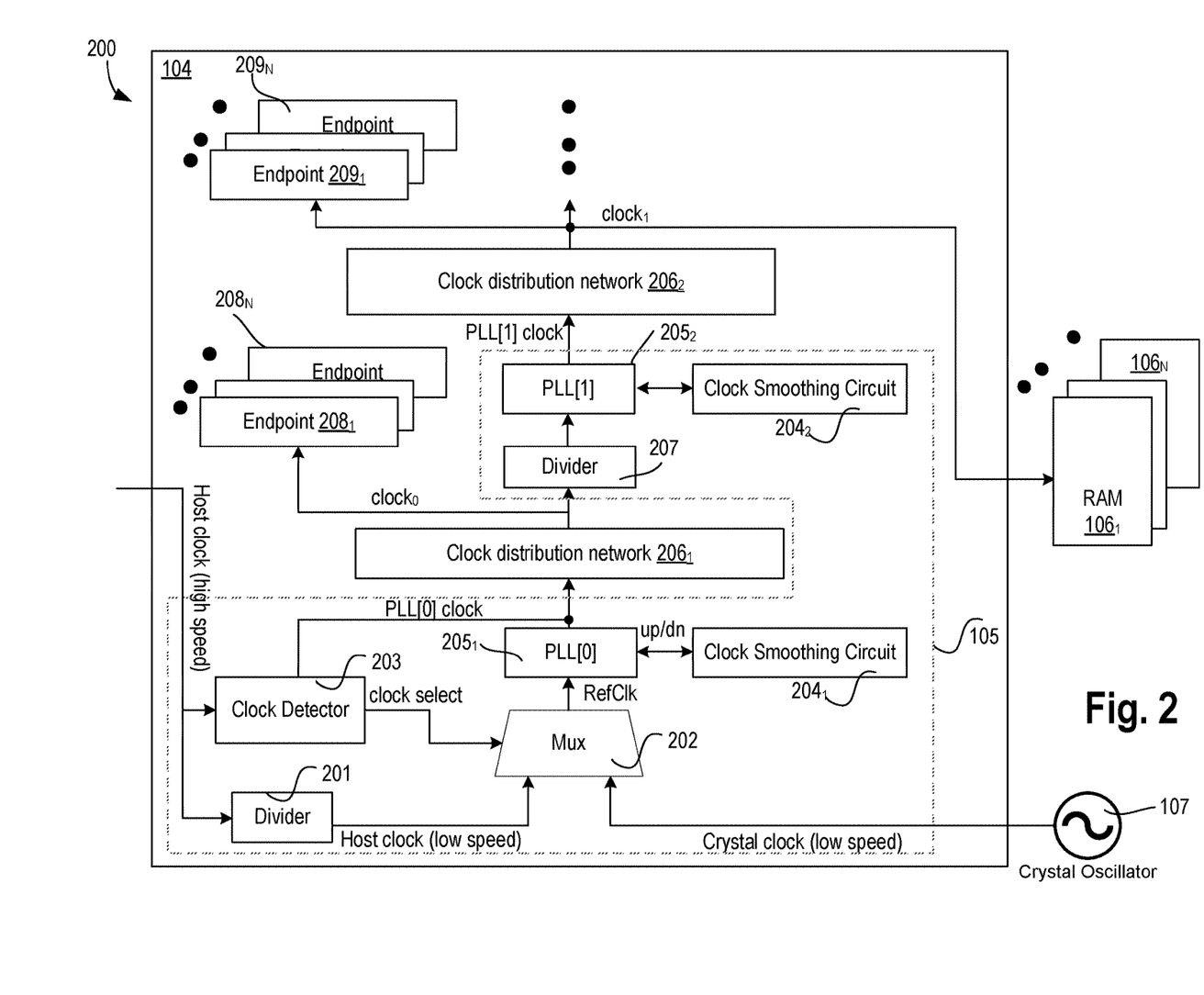
FIG. 2 illustrates a clocking architecture of the memory module with apparatus to maintain stable clocking, according to some embodiments of the disclosure.

FIG. 2 illustrates clocking architecture 200 of memory module 102 with apparatus to maintain stable clocking, according to some embodiments of the disclosure. In some embodiments, clock stabilizer apparatus 105 of clocking architecture 200 comprises divider 201, multiplexer 202, clock detector circuit 203, clock-smoothing circuit 204 (e.g., $204_{1-M}$), and one or more PLLs $205_{1-M}$. Clock detector circuit 203 enables on-the-fly switching of a PLL's $205_1$ reference clock (RefClk) input while maintaining a stable and continuous output clock without re-locking any PLL in memory controller 104. After a surprise clock stop event from host processor 101, clock stabilizer apparatus 105 guarantees on-schedule completion of in-flight operations to the non-volatile memory $106_{1-N}$, thus maintaining normal latency, preserving data integrity, and reducing the cost of hold-up capacitors. Under normal operation of the computer system, divider 201 of memory controller 104 divides the high speed host clock frequency of host clock (e.g., in the 500 MHz to 10 GHz range) to deliver a lower-speed reference clock or host clock (e.g., in the 10 MHz to 200 MHz range) to first PLL[0] $205_1$. This low-speed reference frequency is matched (e.g., within 10%, or within 0.1%) by the frequency of Crystal clock of an on-module crystal oscillator 107 that is unused in normal operation. In various embodiments, controller 104 is designed to support the worst case frequency accuracy specification in PPM (parts per million), whether it is the host crystal oscillator or the on-board one.

First PLL[0] $105_1$ then generates a high-speed output clock (PLL[0] clock) that drives clock distribution network $206_1$; and/or divider 207 to provide a low speed reference clock for one or more additional downstream PLLs $205_2$ that drive additional clock distribution networks and clock domains $206_2$ and onwards. Output clock $clock_0$ of distribution network $206_1$ is used by a clock domain (e.g., endpoints $208_{1-N}$). Here, a clock domain refers to a logic or a group of logic that operates on a particular clock. $Clock_0$ is also used by divider 207 to generate another reference clock for downstream PLL $205_2$. Output clock of PLL[1] $205_2$ is then received by clock distribution network $206_2$ to generate clocks. To reduce any large phase noise in downstream PLL, the downstream PLLs have associated clock smoothing circuits. For example, clock smoothing circuit $204_2$ works with PLL[1] $205_2$. $Clock_1$ is then used by another clock domain (e.g., endpoints $209_{1-N}$). This clock (e.g., clocks) or another downstream clock can be used by memory array or banks $106_{1-N}$. Examples of endpoints include sampling circuits, encoders, decoders, error correction logic, etc. In some embodiments, clock smoothing circuit $204_2$ for PLL[1] and onwards may be removed.

After a surprise clock stop, clock detector circuit 203 provides a continuous and stable clock to memory module 102. In some embodiments, clock detector 203 quickly detects the stopped host clock and initiates a swap from the low-speed, host-derived reference clock to the low-speed, on-module crystal oscillator 107 clock. In some embodiments, clock detector circuit 203 detects a stopped host clock with digital circuitry. For example, clock detector circuit 203 samples a divided-by-2 version of the high-speed host clock with the output (PLL[0] clock) of the first PLL[0] $205_1$, where matched path delays center the rising edge of the PLL[0] clock with respect to the divided-by-2 host clock. When the current sample matches the previous sample, clock detector circuit 203 asserts clock select signal (e.g., Stopped Clock) indicating that the host clock has stopped. Although the output of the first PLL[0] $205_1$ may drift and eventually become unstable without a reference, the clock detection operation completes within a few high-speed host clock cycles, which is a short enough time (e.g., it is less than a low-speed reference clock cycle) to ensure that the output of the first PLL [0] $205_1$ remains stable until the stopped host clock is detected.

Immediately upon detection of a stopped host clock, clock stabilizer apparatus 105 performs an on-the-fly swap to the on-module crystal oscillator 107 as the new reference clock source for the first PLL[0] $205_1$ via multiplexer 202. In this example, there is no need to re-lock any PLL because clock smoothing circuit 204 maintains a stable and continuous output clock from PLL[0] $205_1$ even under this sudden change in reference clock. Clock smoothing circuit 204 allows first PLL[0] $205_1$ to slowly and gradually track the phase of the new reference clock while maintaining a steady output frequency that is well within timing tolerances.

With clock smoothing circuit 204, PLL $205_1$ maintains a stable output clock frequency under sudden phase changes, such as may occur during a reference clock swap, without re-locking. Clock smoothing circuit 204 ensures minimal frequency and phase deviation on the output of first PLL $205_1$ as it slowly aligns to the new reference clock. Downstream PLLs (e.g., $205_{2-M}$) see even smaller frequency and phase deviation due to their low-pass filter characteristic. In this example, PLL[0] $205_1$ provides a reference clock for downstream PLL[1:M] $205_{2-M}$, which clock various domains on the module. The output clocks of all PLL's maintain a consistent period both before and after the clock stop that is well within timing tolerances, with negligible cycle-to-cycle frequency and phase excursions such as would be seen under spread spectrum clocking or natural crystal oscillator drift.

The low-pass filtering characteristic of the downstream PLLs slightly reduces the frequency deviation (e.g., to about 5%) at the output of PLL[1] for the implementation without clock smoothing, whereas with clock smoothing a much smaller frequency deviation is seen (e.g., of less than 0.3%). The common reference clock keeps all on-module PLLs synchronized, and there is no longer a need to synchronize with the host since there is no host clock. In some embodiments, the clock multiplication is advantageous for the high-speed output; even with a sudden maximum input phase error (e.g., of 0.5*$T_{Period}$ of RefClk) clock smoothing circuit 204 limits phase and/or frequency changes in the high-speed oscillator output to be less than a small percentage of the high-speed clock period.

Figure 3:
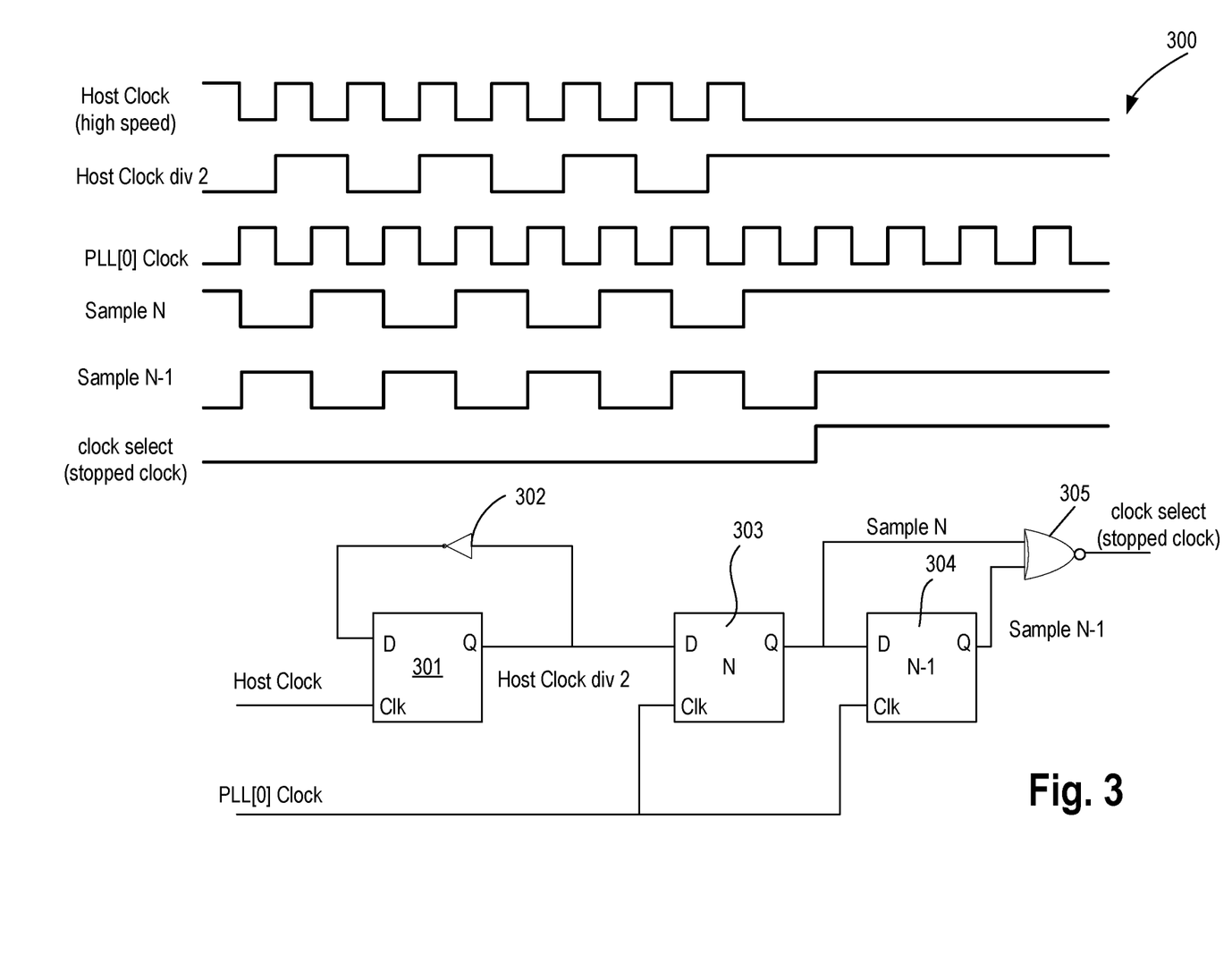
FIG. 3 illustrates an apparatus of a clock detector circuit and associated timing diagram, in accordance with some embodiments.

FIG. 3 illustrates apparatus 300 of a clock detector circuit and associated timing diagram, in accordance with some embodiments. Apparatus 300 comprises flip-flops 301, 303, and 304, inverter 302, and combinational logic 305 (e.g., exclusive NOR gate) coupled together as shown. It samples a divided-by-2 version of the high-speed host clock with PLL[0] clock, where matched path delays center the rising edge of the PLL[0] clock with respect to the divided-by-2 host clock (Host Clock div 2). When the current sample (Sample N) from flip-flop 303 matches the previous sample (Sample N−1) from flip-flop 304, combinational logic 305 asserts the clock signal (Stopped Clock) indicating that the host clock has stopped. Depending on the clock speed, the implementation may use additional sampling depth (e.g., four samples) to further increase robustness against jitter. In one example, two additional flip-flops (not shown) are used to generate Sample N−2 and Sample N−3, which are then compared with Sample N and Sample N−1 before clock select signal is assert indicating that host clock has indeed stopped. Although PLL[0] clock may drift and eventually become unstable without a reference, the clock detection operation completes within a few high-speed host clock cycles, which is a short enough time (indeed, it is less than a low-speed reference clock cycle) to ensure that PLL[0] clock remains stable until the stopped host clock is detected. Not only can some embodiments increase the sampling depth, but also the width. For example, Sample N and Sample N−1 in FIG. 3 are shifted versions of the Host Clock div 2, which is also a 1-bit counter. The counter width could be increased to N-bits. And, the number scheme may be implemented in any style such as gray code, or binary counting.

Figure 4:
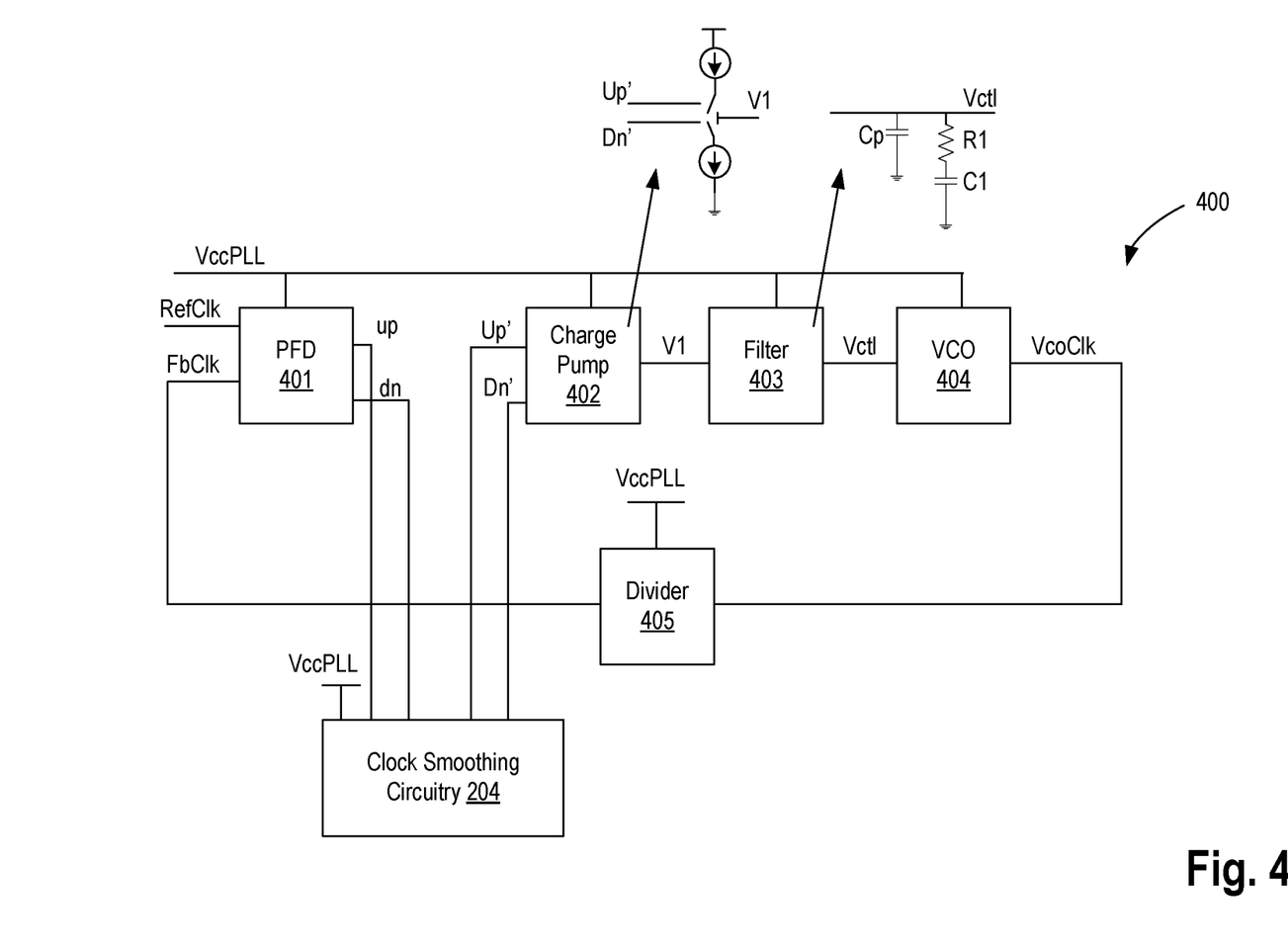
FIG. 4 illustrates a phase locked loop (PLL) coupled to a clock smoothing circuit to adjust up and down pulses, in accordance with some embodiments.

FIG. 4 illustrates a phase locked loop (PLL) coupled to a clock smoothing circuit to adjust up and down pulses, in accordance with some embodiments. PLL 400 comprises phase detector 401 or phase frequency detector (PFD), charge pump 402, filter 403, voltage controlled oscillator (VCO) 404, divider 405, and clock smoothing circuitry 204. So as not to obscure the embodiments, other components of the PLL are not shown such as a lock detector.

Phase detector 401 receives a reference clock (RefClk) and a feedback clock (FbClk) and generates Up and Down (Dn) signals. Up and Dn signals are pulses that represent the relative phase different between the RefClk and the FbClk. In the absence of Clock Smoothing Circuitry 204, Charge pump 402 receives the Up and Dn pulses and sources or sinks current on node V1. The signal on V1 is then filtered by filter 403 (such as a low pass filter (LPF)) to generate a filtered control voltage Vctl. Vctl is then used to control the oscillating frequency of VCO 404. The output of VCO 404 is VcoClk. Divider 405 divides down the frequency of VcoClk by a divider ratio to generate FbClk. During PLL lock, Up and Dn signals provide evidence of dynamic phase error. The divider ratio can be programmable or fixed. The divider ratio can be an integer value or a fractional value. Dynamic phase error is the phase error between RefClk and FbClk before PLL is declared locked. A PLL is declared locked when the phase difference between RefClk and FbClk is below a predetermined threshold.

Some implementations of phase detector 401 use analog circuit techniques, while others use digital circuitry. Phase detector 401 can be designed to be sensitive to just phase or sensitive to frequency and to phase. When phase detectors are only sensitive to phases of RefClk and FbClk, they produce an output that is proportional to the phase difference between the two signals. When the phase difference between the RefClk and FbClk is steady, phase detector 401 produces a constant voltage. When there is a frequency difference between the two signals (RefClk and FbCLk), phase detector 401 produces a varying voltage. Example implementations of phase detectors 401 include diode based ring phase detector, exclusive OR phased phase detector, JK flip-flop based comparators, and dual D-type phase detectors. Generally, when a digital phase detector is to implement phase detector 401, short Up and Dn pulses are created by the logic gates of the digital phase detector. The static phase error is the pulse width difference between Up and Dn pulses, which is caused by leakage current and the charge pump current mismatch When the PLL is in the normal mode of operation, PFD outputs a pulse with time duration proportional to the phase error between the RefClk and FBClk inputs of the PLL. The pulses enable a charge pump to either source or sink a quantity of charge in proportion to the sign and magnitude of the phase error. The charge is pumped on to a capacitor (Cp) and filtered to provide a control voltage for VCO 404 that speeds or slows its output frequency in response to the change in the control voltage (Vctl). Eventually the PLL reaches a steady "locked" state with nearly constant Vctl and minimal phase error. The div-by-N divider 405 allows the PLL to output a frequency N times larger than the Refclk frequency.

A sudden change in the source of the RefClk can introduce a large phase error at the input to PFD 401. As can be seen, the amount of charge sourced or sunk from the capacitor Cp to control VCO 404 is a function of the phase error. The amount of charge per unit time sampled on the capacitor is a function of the capacitor size (Cp) and the change in charge per unit time, or current (Ip=dQ/dT). For a moment, consider limiting this change in charge to something less than the maximum that can be sourced or sunk over a RefClk period ($T_{Period}$). Since the change in the Vctl voltage is proportional to current, this now limits the maximum change in Vctl to $$\frac{Ip}{2\pi Cp} * t0, \ (t0 \ll T_{Period}).$$

(t0<<$T_{Period}$). This implies that the gain of PFD 401 and charge pump system 402 can be saturated to stop VCO 404 from abruptly changing phase and/or frequency due to a suddenly large phase error. In various embodiments, clock smoothing circuit 204 intercepts PFD output (up and dn) and limits the pulse length to t0<(1%*$T_{Period}$). As such, modified up and down pulses (Up' and Dn') are provided to charge pump 402 to limit the amount of charge sunk or sourced to node V1. The limitation of the pulse width to t0 results in a similarly reduced proportion of change (e.g., approx. 1%) in the output phase and frequency of the high-speed oscillator clock. Note that t0 can be values other than 1%, depending on system design considerations. With clock smoothing circuit 204, a PLL maintains a stable output clock frequency under sudden phase changes greater than t0, such as may occur during a reference clock swap, without re-locking. The clock smoothing circuit ensures minimal frequency and phase deviation on the output of the first PLL as it slowly aligns to the new reference clock.

While PLL 400 is illustrated as an analog PLL, any type of PLL may be used to generate Clock. For example, mixed-signal PLL, all digital PLL, etc. may be used with a clock smoothing circuitry 204. In some embodiments, PFD 401 may be replaced with a time-to-digital converter (TDC). In one such embodiment, a digital clock smoothing circuit monitors the digital stream output of TDC and digitally processes it to smooth sudden large changes in phase. Here, the output may remain in digital format or be converted to an analog output. In some embodiments, filter 403 may be replaced with an all-digital filter using well-known digital filter implementations (e.g., finite impulse response (FIR) or infinite impulse response (IIR)). In one such embodiment, the digital filter receives a digital input from the clock smoothing circuit or from an analog-to-digital converter. In some embodiments, VCO 404 may be replaced with a digitally controlled oscillator or DCO. In one such embodiment, the DCO receives a digital input from a digital filter or an analog input is converted to a digital representation via an analog to digital converter.

Figure 5:
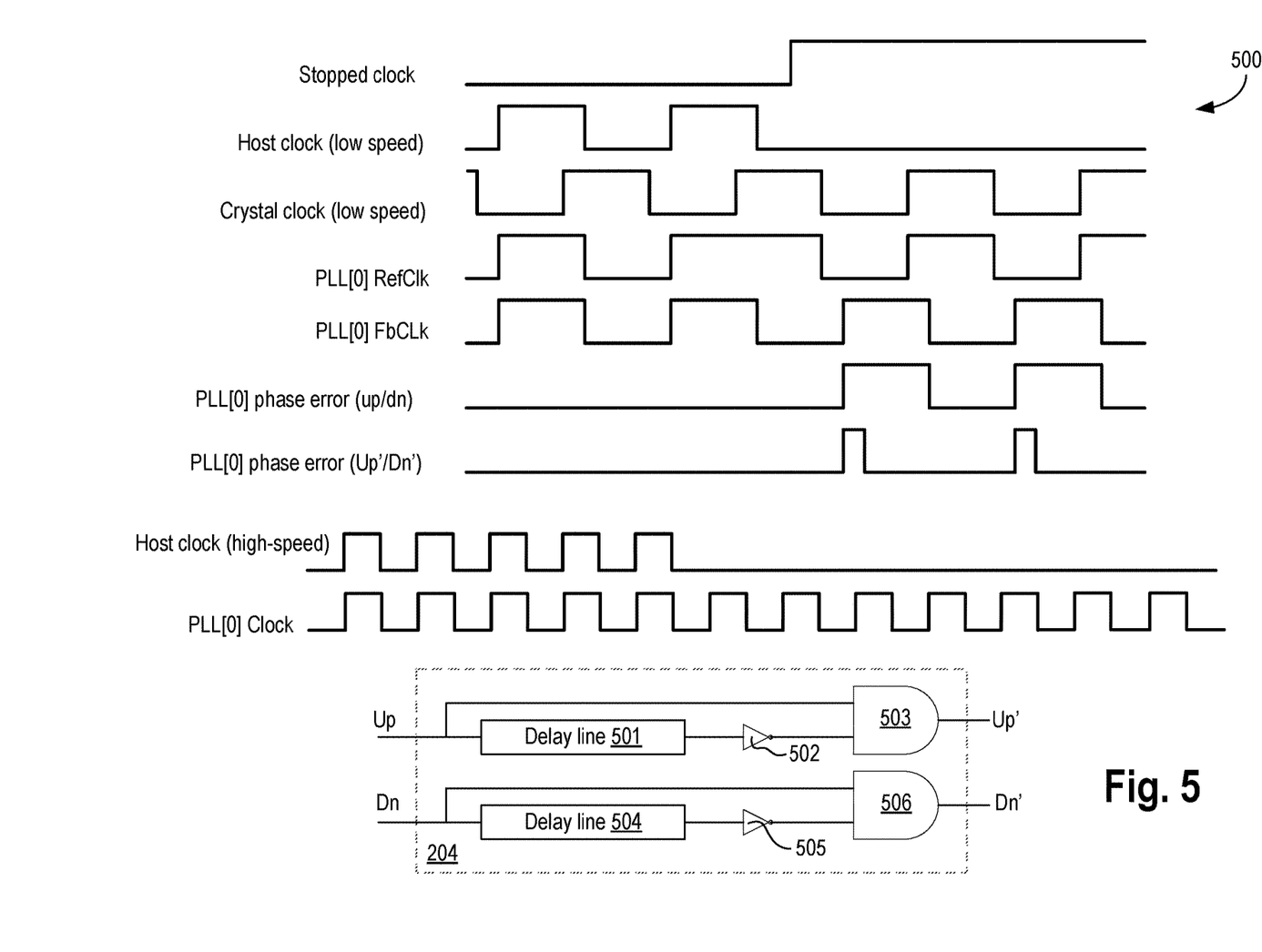
FIG. 5 illustrates apparatus for clock smoothing and associated timing diagram, in accordance with some embodiments.

FIG. 5 illustrates apparatus 500 for clock smoothing and associated timing diagram, in accordance with some embodiments. Apparatus 500 comprises delay line 501, inverter 502, AND gate 503, delay line 504, inverter 505, and AND gate 506 coupled together as shown. Upon a surprise clock stop, the "Stopped Clock" signal (or clock select signal) asserts, initiating a swap of the PLL[0] input reference clock from the low-speed host clock to the low-speed crystal oscillator clock. Note that the frequencies of the two low-speed clocks match to within parts per million (PPM), as the eventual source for the host clock is also a crystal oscillator. However, any arbitrary phase relationship may exist between the two low-speed clocks, so PLL[0] reference clock edge may suddenly have a large phase error with respect to the feedback clock. After a clock swap by multiplexer 202, this phase error (also represented as the up/down signal from PFD 401 or by a digital stream output from a TDC) may be a significant portion of a reference clock period, which in turn, would cause PLL[0] $205_1$ to significantly slow down or speed up without clock smoothing circuit 204. However, clock smoothing circuit 204 intercepts the raw PFD output (up and dn) and sends it through a programmable, inverting delay line (501 and 504) that is AND-ed (by 503 and 506) with the raw PFD output (Up and Dn). This logic limits the phase error seen by the PLL[0] (represented as the Up'/Dn' signals) and maintains the stable and continuous output clock to the clock distribution network.

In one example, for the case of a 100 MHz Refclk, a 1% limit on t0, and N=32, a sudden input phase error of 5 ns results in a maximum excursion of 3.125 ps (=0.01*$T_{period}$/N) on the high-speed 3200 MHz output clock. This is on the order of the natural jitter from inherent sources of PLL noise (e.g., thermal noise, supply noise, and feed-through noise). With this context also comes a more precise definition of maintaining a "continuous and stable" clock under a surprise clock stop: it means that the output clock smoothing circuit limits phase or frequency excursions of the high-speed clock to be lower in magnitude than those from the inherent noise during the normal operation of the locked PLL.

Figure 6:
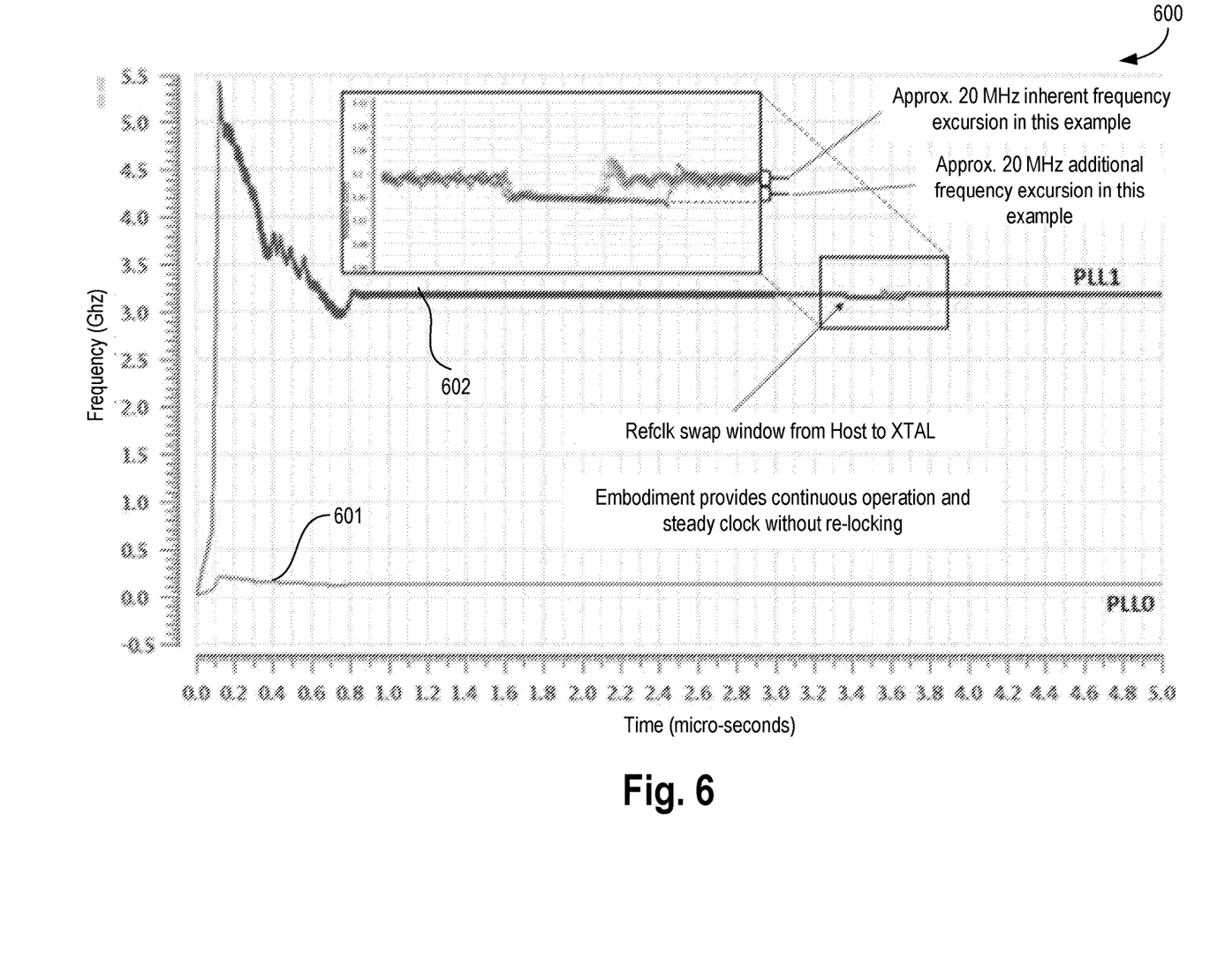
FIG. 6 illustrates a plot showing clock swap performance of the PLL and the clock smoothing circuit, in accordance with some embodiments.

FIG. 6 illustrates plot 600 showing clock swap performance of the PLL and the clock smoothing circuit, in accordance with some embodiments. Plot 600 shows PLL[0] 601 and PLL[1] 601 output clocks; the additional PLL's have similar performance. In plot 600, both PLL[0] and PLL[1] first start-up and lock; then the surprise clock stop occurs around the 3.4 us mark, as shown in the windowed portion of the waveforms. The circuit simulation includes feed-through noise, which causes inherent frequency excursions of around 20 MHz (or less than 1%) in the locked PLL[1]. After the surprise clock stop and switch to the new reference clock, the clock smoothing circuit limits the additional noise introduced into the output clock of PLL[0] to less than 1 MHz and the additional noise introduced into the output clock of PLL[1] to less than 20 MHz. The frequency excursion in the circuit simulation is much less than total noise expected on the output of the PLL due to all sources of inherent noise while in normal, locked operation.

While the embodiments are described with reference to oscillator providing low speed clock to mux 202, the reverse process can also occur. For example, upon memory module power up, where the oscillator 107 may be the only available clock, and the switch over to the HOST clock occurs when the host clock is stable. In some embodiments, the switch may also occur without a clock detect circuit, and instead switching of clock inputs may occur based upon an explicit external control signal.

Figure 7:
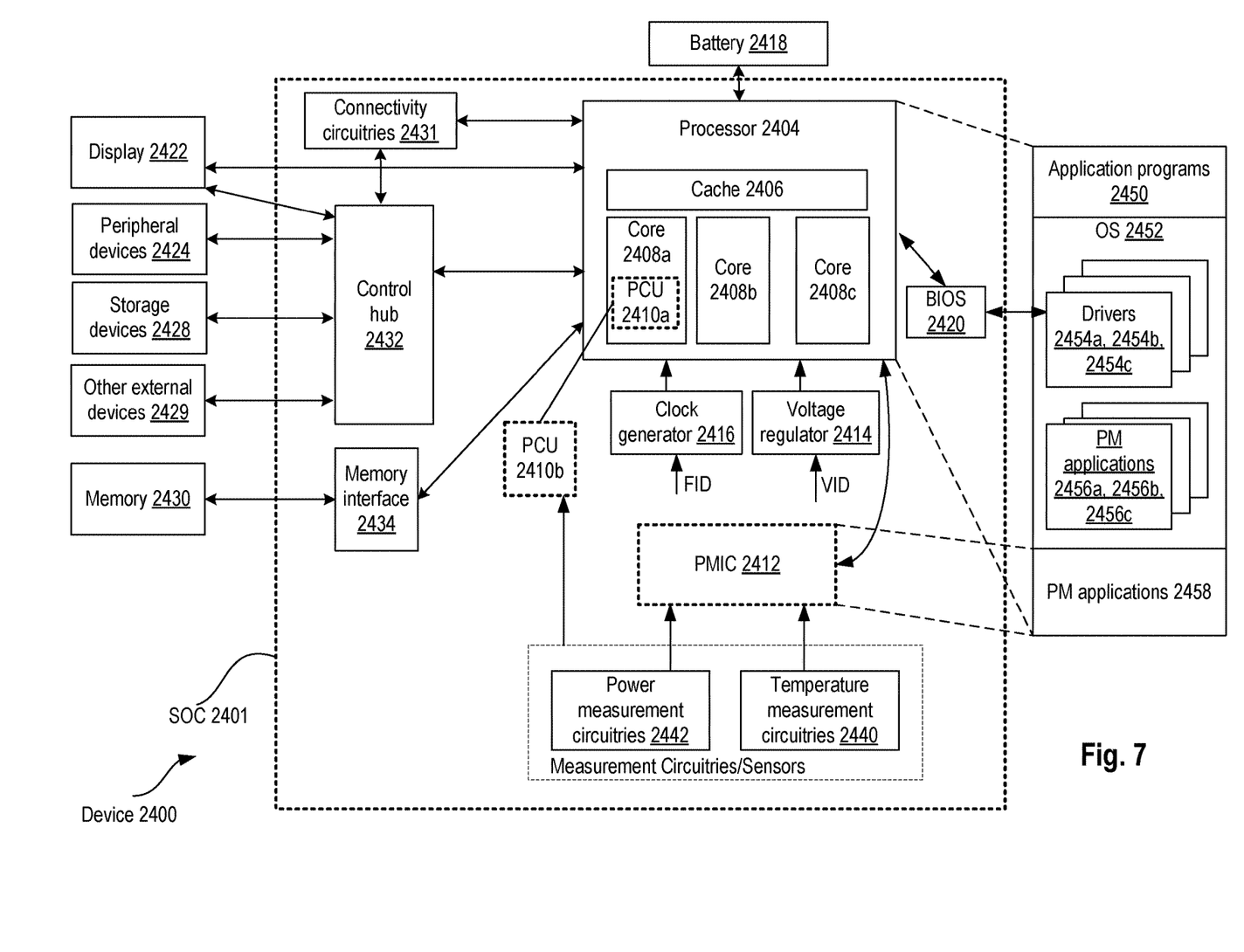
FIG. 7 illustrates a smart device or a computer system or a SoC (System-on-Chip) having apparatus to maintain stable clocking, according to some embodiments of the disclosure.

FIG. 7 illustrates a smart device or a computer system or a SoC (System-on-Chip) having apparatus to maintain stable clocking, according to some embodiments of the disclosure. It is pointed out that those elements of FIG. 7 having the same reference numbers (or names) as the elements of any other figure can operate or function in any manner similar to that described, but are not limited to such.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 1, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 7, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400. In some embodiments, storage device 2428 may include the apparatus.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

EXAMPLE 1

An apparatus comprising: a first circuitry to select one of a first clock or a second clock; a phase locked loop (PLL) to receive an output of the first circuitry as a reference clock to the PLL; and a second circuitry coupled to the PLL, wherein the second circuitry is to detect presence or absence of the first clock and to provide a select signal to the first circuitry to: select the first clock as the output of the first circuitry if the first clock is present; and select the second clock as the output of the first circuitry if the first clock is absent.

EXAMPLE 2

The apparatus of example 1 comprises a third circuitry to adjust up and down pulses from a phase detector of the PLL when the first circuitry selects the second clock.

EXAMPLE 3

The apparatus of example 1 comprises a fourth circuitry to divide a third clock to generate the first clock.

EXAMPLE 4

The apparatus of example 3, wherein the third clock is generated by a host processor.

EXAMPLE 5

The apparatus of example 1 wherein the second clock is generated by a crystal oscillator, wherein a frequency of the first clock is substantially same as frequency of the second clock.

EXAMPLE 6

The apparatus of example 1, wherein the first circuitry comprises a multiplexer.

EXAMPLE 7

The apparatus of example 1, wherein the second circuitry comprises: a first flip-flop having a clock input that receive the first clock, an output coupled to an input via an inverter; a second flip-flop having a clock input that receives an output of the PLL, an input coupled to the output of the first flip-flop, and an output; a third flip-flop having a clock input that receive the output of the PLL, an input coupled to the output of the second flip-flop, and an output; and a combinational logic to receive the outputs of the second and third flip-flops, wherein an output of the combination logic provides the select signal.

EXAMPLE 8

The apparatus of example 2, wherein the third circuitry comprises: a first programmable delay line to receive the up pulse; a first inverter coupled to an output of the first programmable delay line; a first combinational logic to receive the up pulse and the output of the first inverter, wherein an output of the first combinational logic is to provide the adjusted up pulse; a second programmable delay to receive the down pulse; a second inverter coupled to an output of the first programmable delay line; and a second combinational logic to receive the down pulse and the output of the second inverter, wherein an output of the combinational logic is to provide the adjusted down pulse.

EXAMPLE 9

The apparatus of example 1 comprises a clock distribution network coupled to an output of the PLL.

EXAMPLE 10

The apparatus of example 9, wherein the reference clock is a first reference clock, wherein the PLL is a first PLL, wherein the apparatus comprises: a divider to divide an output of the first PLL and to generate a second reference clock; and a second PLL to receive the second reference clock.

EXAMPLE 11

The apparatus of example 10, wherein the clock distribution network is a first clock distribution network, wherein the apparatus comprising a second clock distribution network coupled to an output of the second PLL, wherein an output of the second clock distribution network is received by a memory.

EXAMPLE 12

The apparatus of example 10, wherein the first and second PLLs are one of analog PLL or a digital PLL.

EXAMPLE 13

An apparatus comprising: a phase locked loop (PLL) to receive a reference clock and to generate an output clock, which is used directly or indirectly, to write data to a memory; and circuitry to detect a valid first clock and to cause a multiplexer to provide a second clock as the reference clock when the first clock is invalid.

EXAMPLE 14

The apparatus of example 13, wherein the circuitry is a first circuitry, and wherein the apparatus comprises a second circuitry to adjust up and down pulses from the PLL when the multiplexer provides the second clock as the reference clock.

EXAMPLE 15

The apparatus of example 14 comprises a third circuitry to divide the first clock to generate a third clock, wherein the third clock and the second clock are input to the multiplexer.

EXAMPLE 16

The apparatus of example 13, wherein the first clock is generated by a host processor.

EXAMPLE 17

The apparatus of example 15, wherein the second clock is generated by a crystal oscillator, and wherein a frequency of the third clock is substantially same as frequency of the second clock.

EXAMPLE 18

A system comprising: a processor; a memory module coupled to the processor, wherein the processor is to send a first clock to the memory module, wherein the memory module comprises: a first circuitry to select one of the first clock or a second clock; a phase locked loop (PLL) to receive an output of the first circuitry as a reference clock to the PLL; and a second circuitry coupled to the PLL, wherein the second circuitry is to detect presence or absence of the first clock and to provide a select signal to the first circuitry to: select the first clock as the output of the first circuitry if the first clock is present; and select the second clock as the output of the first circuitry if the first clock is absent; and a wireless interface to allow the processor to communicate with another device.

EXAMPLE 19

The system of example 18, wherein the memory module comprises: a third circuitry to adjust up and down pulses from a phase detector of the PLL when the first circuitry selects the second clock; and a fourth circuitry to divide a third clock to generate the first clock.

EXAMPLE 20

The system of example 18 wherein the second clock is generated by a crystal oscillator, wherein a frequency of the first clock is substantially same as frequency of the second clock.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first circuitry to select one of a first clock or a second clock;
   a phase locked loop (PLL) to receive an output of the first circuitry as a reference clock to the PLL: and
   a second circuitry coupled to the PLL, wherein the second circuitry is to detect presence or absence of a third clock and to provide a select signal to the first circuitry to: select the first clock as the output of the first circuitry if the third clock is present; and
   select the second clock as the output of the first circuitry if the third clock is absent; and
   a third circuitry to divide the third clock to generate the first clock.

2. The apparatus of claim 1, further comprising a fourth circuitry to adjust up and down pulses from a phase detector of the PLL when the first circuitry selects the second clock.

3. The apparatus of claim 1, wherein the third clock is generated by a host processor.

4. The apparatus of claim 1, wherein the second clock is generated by a crystal oscillator, and wherein a frequency of the first clock is substantially same as a frequency of the second clock.

5. The apparatus of claim 1, wherein the first circuitry comprises a multiplexer.

6. The apparatus of claim 1, wherein the second circuitry comprises:
   a first flip-flop having a clock input that receive the first clock, an output coupled to an input via an inverter;
   a second flip-flop having a clock input that receives an output of the PLL, an input coupled to the output of the first flip-flop, and an output;

a third flip-flop having a clock input that receive the output of the PLL, an input coupled to the output of the second flip-flop, and an output; and a combinational logic to receive the outputs of the second and third flip-flops, wherein an output of the combination logic provides the select signal.

7. The apparatus of claim 2, wherein the fourth circuitry comprises:

a first programmable delay line to receive the up pulse;

a first inverter coupled to an output of the first programmable delay line;

a first combinational logic to receive the up pulse and the output of the first inverter, wherein an output of the first combinational logic is to provide the adjusted up pulse;

a second programmable delay to receive the down pulse;

a second inverter coupled to an output of the first programmable delay line; and a second combinational logic to receive the down pulse and the output of the second inverter, wherein an output of the combinational logic is to provide the adjusted down pulse.

8. The apparatus of claim 1, further comprising a clock distribution network coupled to an output of the PLL.

9. The apparatus of claim 8, wherein the reference clock is a first reference clock, wherein the PLL is a first PLL, and wherein the apparatus comprises:

a divider to divide an output of the first PLL and to generate a second reference clock; and a second PLL to receive the second reference clock.

10. The apparatus of claim 9, wherein the clock distribution network is a first clock distribution network, wherein the apparatus comprises a second clock distribution network coupled to an output of the second PLL, and wherein an output of the second clock distribution network is received by a memory.

11. The apparatus of claim 9, wherein the first and second PLLs are one of an analog PLL or a digital PLL.

12. An apparatus comprising:

a phase locked loop (PLL) to receive a reference clock and to generate an output clock, which is used directly or indirectly, to write data to a memory; and a first circuitry to detect a valid first clock and to cause a multiplexer to provide a second clock as the reference clock when the first clock is invalid;

a second circuitry to adjust up and down pulses from the PLL when the multiplexer provides the second clock as the reference clock; and a third circuitry to divide the first clock to generate a third clock, wherein the third clock and the second clock are input to the multiplexer.

13. The apparatus of claim 12, wherein the first clock is generated by a host processor.

14. The apparatus of claim 12, wherein the second clock is generated by a crystal oscillator, and wherein a frequency of the third clock is substantially same as a frequency of the second clock.

15. A system comprising:

a processor;

a memory circuitry coupled to the processor, wherein the processor is to send a first clock to the memory circuitry, wherein the memory circuitry comprises:

a first circuitry to select one of the first clock or a second clock;

a phase locked loop (PLL) to receive an output of the first circuitry as a reference clock to the PLL; and a second circuitry coupled to the PLL, wherein the second circuitry is to detect presence or absence of the first clock and to provide a select signal to the first circuitry to:

select the first clock as the output of the first circuitry if the first clock is present; and select the second clock as the output of the first circuitry if the first clock is absent;

a third circuitry to adjust up and down pulses from a phase detector of the PLL when the first circuitry selects the second clock; and a fourth circuitry to divide a third clock to generate the first clock; and a wireless interface to allow the processor to communicate with another device.

16. The system of claim 15, wherein the second clock is generated by a crystal oscillator, and wherein a frequency of the first clock is substantially same as a frequency of the second clock.

17. An apparatus comprising:

a first circuitry to select one of a first clock or a second clock;

a first phase locked loop (PLL) to receive an output of the first circuitry as a first reference clock to the first PLL;

a second circuitry coupled to the first PLL, wherein the second circuitry is to detect presence or absence of the first clock and to provide a select signal to the first circuitry to:

select the first clock as the output of the first circuitry if the first clock is present; and select the second clock as the output of the first circuitry if the first clock is absent;

a divider to divide an output of the first PLL and to generate a second reference clock; and a second PLL to receive the second reference clock.

18. The apparatus of claim 17, wherein the apparatus comprises a clock distribution network coupled to an output of the second PLL, and wherein the clock distribution network is to provide an output of the clock distribution network to a memory.

19. The apparatus of claim 17, wherein the first and second PLLs are one of an analog PLL or a digital PLL.

* * * * *